(12) United States Patent
Ryding et al.

(10) Patent No.: US 7,582,883 B2
(45) Date of Patent: Sep. 1, 2009

(54) METHOD OF SCANNING A SUBSTRATE IN AN ION IMPLANTER

(75) Inventors: Geoffrey Ryding, Manchester, MA (US); Takao Sakase, Rowley, MA (US); Marvin Farley, Ipswich, MA (US); Theodore H. Smick, Essex, MA (US)

(73) Assignee: Applied Materials, Inc., Santa Clara, CA (US)

( * ) Notice: Subject to any disclaimer, the term of this patent is extended or adjusted under 35 U.S.C. 154(b) by 197 days.

(21) Appl. No.: 11/652,645

(22) Filed: Jan. 12, 2007

(65) Prior Publication Data
US 2008/0169434 A1    Jul. 17, 2008

(51) Int. Cl.
    *G21K 5/10*    (2006.01)
(52) U.S. Cl. ............... 250/492.21; 250/492.1; 250/492.2; 250/492.22; 250/492.3
(58) Field of Classification Search ............ 250/492.21, 250/491.1, 492.1, 492.2, 492.22, 492.3, 440.11, 250/442.11; 204/192.11
See application file for complete search history.

(56) References Cited

U.S. PATENT DOCUMENTS

| | | | |
|---|---|---|---|
| 5,434,424 A * | 7/1995 | Stickel et al. .......... 250/492.23 |
| 6,579,420 B2 * | 6/2003 | Wan et al. ............... 204/192.11 |
| 6,646,276 B1 * | 11/2003 | Mitchell et al. ........ 250/492.21 |
| 6,750,462 B2 * | 6/2004 | Iwasawa et al. .......... 250/492.3 |
| 6,908,836 B2 * | 6/2005 | Murrell et al. .............. 438/535 |
| 6,956,223 B2 | 10/2005 | Smick et al. |
| 2001/0032937 A1 | 10/2001 | Berrian |
| 2005/0184253 A1 * | 8/2005 | Ioannou et al. ......... 250/492.21 |
| 2005/0263721 A1 * | 12/2005 | Renau et al. ........... 250/492.21 |
| 2007/0105355 A1 | 5/2007 | Murrell et al. |
| 2008/0078950 A1 * | 4/2008 | Buonodono et al. ..... 250/492.21 |
| 2008/0141802 A1 | 6/2008 | Smick et al. |
| 2008/0142726 A1 | 6/2008 | Relleen et al. |
| 2008/0149826 A1 * | 6/2008 | Renau et al. ................. 250/288 |

* cited by examiner

*Primary Examiner*—Jack I Berman
*Assistant Examiner*—Nicole Ippolito Rausch
(74) *Attorney, Agent, or Firm*—Boult Wade & Tennant (57) ABSTRACT

This invention relates to a method of scanning a substrate through an ion beam in an ion implanter to provide uniform dosing of the substrate. The method comprises causing relative motion between the substrate and the ion beam such that the ion beam passes over all of the substrate and rotating the substrate substantially about its centre while causing the relative motion. Rotating the substrate while causing the relative motion between the substrate and the ion beam has several advantages including avoiding problematic angular effects, increasing uniformity, increasing throughput and allowing a greater range of ion beam profiles to be tolerated.

19 Claims, 7 Drawing Sheets

METHOD OF SCANNING A SUBSTRATE IN AN ION IMPLANTER

FIELD OF THE INVENTION

This invention relates to a method of scanning a substrate through an ion beam in an ion implanter to provide uniform dosing of the substrate. The invention also relates to an ion implanter arranged to perform this method of scanning a substrate.

BACKGROUND OF THE INVENTION

Ion implanters are well known and generally conform to a common design as follows. An ion source produces a mixed beam of ions from a precursor gas or the like. Only ions of a particular species are usually required for implantation in a substrate, for example a particular dopant for implantation in a semiconductor wafer. The required ions are selected from the mixed ion beam using a mass-analysing magnet in association with a mass-resolving slit. Hence, an ion beam containing almost exclusively the required ion species emerges from the mass-resolving slit to be transported to a process chamber where the ion beam is incident on a substrate held in place in the ion beam path by a substrate holder.

Ion beams of different shapes have been used in the past. Ribbon beams are well known and generally have a major axis that is greater in dimension than the substrate to be implanted and a minor axis much smaller than the substrate. Another common type of ion beam is the spot ion beam where the cross-sectional profile of the ion beam is much smaller in all directions than the substrate to be implanted. With either type of ion beam, the ion beam and substrate are moved relative to one another such that the ion beam scans the entire substrate surface with the aim of achieving a uniform ion implant across the whole of the substrate. For a ribbon beam, only one scan across the substrate is required, whereas multiple scans are required for a spot beam. Scanning may be achieved by (a) deflecting an ion beam to scan across a substrate that is held in a fixed position, (b) mechanically moving a substrate whilst keeping an ion beam path fixed or (c) a combination of deflecting an ion beam and moving a substrate.

Figure 1:
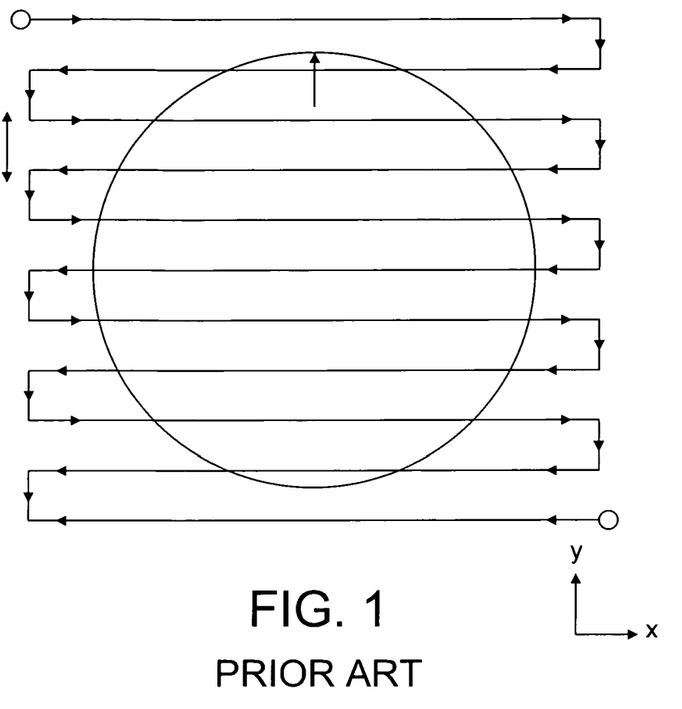
FIG. 1 illustrates a raster scan pattern of an ion beam across a wafer.

Our U.S. Pat. No. 6,956,223 describes an ion implanter of the general design described above that uses a spot beam. While some steering of the ion beam is possible, the implanter is operated such that ion beam follows a fixed path during implantation. Instead, a wafer is held in a substrate holder that is moved along two orthogonal directions to cause the ion beam to trace over the wafer following a raster pattern like that illustrated in FIG. 1. First, the wafer is moved continuously in a single direction (the fast-scan direction) to complete a first scan line. The substrate is then stepped down a short distance orthogonally (in the slow-scan direction), and then moved back along the fast-scan direction to form a second scan line across the wafer to overlap with the first scan line. This process is then repeated such that the combination of tracing scan lines punctuated by the stepwise movement results in the whole surface of the wafer seeing the ion beam. The series of scan lines that leads to a complete dosing of the wafer is referred to herein as a "pass". An implant may comprise multiple passes over the wafer.

Further improvements may be made to improve the uniformity of implants made using such raster scans. For example, multiple passes over the substrate may be made and interlacing may be effected (e.g. make a first pass implanting the first, fifth, ninth, etc. scan lines, then make a second pass implanting the second, sixth, tenth, etc. scan lines, then make a third pass, etc.). Also a problem of angular effects (i.e. off-normal incidence of the ion beam or asymmetries in the ion beam) may be addressed by making multiple passes with rotation of the wafer between passes. For example, in a quad implant four (or a multiple of four) passes are made with a 90° twist of the substrate between each pass. Changing the orientation of the wafer clearly helps alleviate such angular effects. Our U.S. patent application Ser. No. 11/527,594 (U.S. Patent Application Publication No. 2007/0105355) provides more details of such scanning techniques. While such techniques offer excellent uniformity in dosing, the need to perform multiple passes has an associated time overhead that reduces the throughput of the ion implanted.

Figure 2:
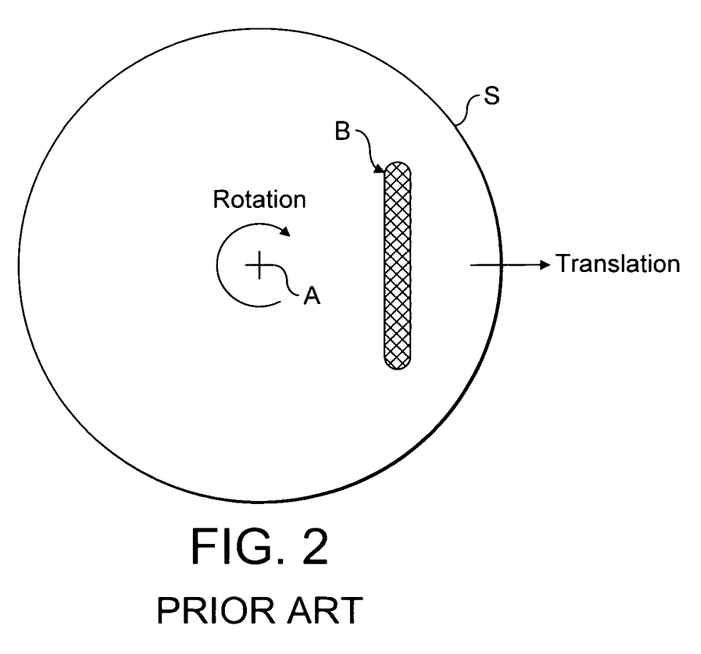
FIG. 2 illustrates a method of scanning a substrate through an ion beam according to the prior art.

U.S. Patent Application Publication No. 2001/0032937 describes a very different method of scanning a substrate that does not rely solely on linear movement of the substrate relative to the ion beam. Instead, as illustrated in FIG. 2, a substrate is spun about its central axis with a constant angular velocity, while also being translated across a fixed position, elongate spot ion beam. Movement of the substrate effectively sees the ion beam travel through the centre of the substrate. The ion beam is unusual in that it is nether a conventional spot beam, nor is it a ribbon beam. Rather, it is elongated such that it has a longer major axis that is smaller than the width of the substrate.

As the ion beam first clips the substrate, the rotation of the substrate sees the ion beam implant the periphery of the substrate: as the substrate is translated across the ion beam, the implanted region grows in width and spirals into the centre of the substrate before spiraling out and moving off the periphery of the substrate. However, the linear speed of the edge of the spinning substrate is much faster than the linear speed of the centre of the substrate. To compensate for this effect, the substrate is translated at a variable velocity through the ion beam such that its speed is greatest at the centre of the substrate.

In practice, such a technique is difficult to implement. The control law for the translational velocity is complex and achieving accurate control of this varying velocity is problematic. Worse still, to achieve high uniformity of implant across the substrate requires exceptional uniformity in the ion beam.

SUMMARY OF THE INVENTION

Against this background, and from a first aspect, the present invention resides in a method of scanning a substrate through an ion beam in an ion implanter, comprising: causing relative motion between the substrate and the ion beam such that the ion beam passes over all of the substrate; and rotating the substrate substantially about its centre while causing the relative motion. The relative motion is caused such that the ion beam would pass over all of the substrate even if the substrate were not rotating.

Rotating the substrate while causing the relative motion between the substrate and the ion beam has several advantages. Briefly, problems of angular effects are overcome, uniformity is improved, throughput may be increased, and a greater range of ion beam profiles may be tolerated. More specifically, the velocity control law problem inherent in the arrangement of US2001/0032937 may be avoided.

Where the ion beam is a ribbon beam, the method may comprise causing a relative motion between the substrate and the ribbon beam such that all of the substrate passes through the ribbon beam. This relative motion may be performed in one pass. Hence, a single scan line is formed. This method has some similarities with US2001/0032937. Instead of a tall spot beam, a ribbon beam is used. However this simple change has a huge benefit, namely that the relative motion between the substrate and the ion beam may be effected with a constant speed while still achieving a uniform implant. Hence, the complex velocity control law of US2001/0032937 is avoided. In addition to maintaining a constant speed of the relative motion, a constant rotational speed is also preferably employed.

Where the ion beam is a spot ion beam, the method may comprise causing the relative motion between the substrate and the ion beam such that the ion beam passes over all of the substrate by causing a series of translations of the substrate relative to the ion beam such that the ion beam traces a series of scan lines over the substrate.

Compared to US2001/0032937, forming multiple scan lines to cover the substrate as if it were not rotating sees a uniform implant when the relative motion is effected as a constant speed. Hence, the complex velocity control laws are avoided.

These scan lines may be formed so as to be parallel or substantially parallel. The scan lines may all be formed in a common direction or may be formed by a reciprocal motion such that the scan lines extend back and forth. The scan lines may be arcuate. Alternatively, the scan lines may be linear such that a raster scan or saw-tooth scan is formed. The raster scan may be formed by performing a reciprocal motion in a fast-scan direction while performing an intermittent stepwise motion in a slow-scan direction. The saw-tooth scan may be formed by performing a reciprocal motion in a fast-scan direction while performing a continuous motion in a slow-scan direction.

Preferably, scan lines are arranged so as to overlap. By this, it is meant that if the substrate were not to be spun, a series of overlapping regions of the substrate that are implanted during each movement along a scan line would result. Advantageously, the scan lines may be arranged so as to have minimal overlap. For example, if the scan lines have a pitch P and the ion beam a. dimension D in the pitch direction, the pitch may be just less than that dimension. As an example, the pitch P may be 5% or less than that dimension D. It may be greater than 0.9 times the dimension D. Put another way, the pitch may be approximately equal to the ion beam's dimension in the pitch direction, say 50 mm each. These values work well with disk-like substrates of 300 mm diameter, as are typical in the semiconductor wafer industry.

With either type of ion beam, a motion is imparted between substrate and ion beam that sees a translational motion and a rotational motion. The translational motion may be achieved by translating the substrate or by scanning the ion beam (e.g. by electrostatic deflection), or by a combination of the two.

The rotation preferably occurs for each scan line. The rotational motion has several advantages. First, the rotation helps overcome the problematic angular effects described above. Whereas quad implants alleviate these problems by using orientations of the substrate at four angles, the present invention provides a continuous range of angles in a single pass. Hence the need for time-consuming multiple passes is avoided. Preferably, the substrate is rotated such that it performs at least a complete revolution as the ion beam scans across a or each scan line. More preferably, the substrate is rotated so as to complete fifteen to twenty revolutions as the ion beam scans across a or each scan line. This means that the ion beam traces a spiral across the substrate that has a reasonable number of revolutions.

Where the ion beam is a spot beam, the method may comprise rotating the substrate and/or causing the relative motion between the substrate and the ion beam such that the resulting spirals traced by the ion beam over the substrate overlap on adjacent revolutions.

Other advantages are obtained by rotating the substrate while causing the relative motion between the substrate and ion beam. Uniformity of implant benefits greatly from this method, namely the uniformity of the dose received by different parts of the substrate. In addition, excellent uniformity may be achieved even where a large pitch is used between scan lines. To illustrate this, when performing a traditional raster scan where no rotation of the substrate is performed, pitches are chosen so as to provide a large overlap between adjacent scan lines in order to ensure good uniformity. This results in a large number of scan lines that lengthens the implant process. In contrast, only minimal overlap is required for the present invention. As a result, the pitch can be increased such that fewer scan lines are needed. This of course means that substrates may be implanted more quickly, thereby increasing the throughput of the ion implanter.

Another advantage that follows from the general improvements in uniformity is that a larger range of beam profiles and imperfections may be tolerated.

Optionally, the method may comprise causing relative motion between the substrate and the ion beam to form a scan line such that a point in the ion beam, having an average value of the total ion beam current along a section taken through the ion beam orthogonal to the direction of relative motion, passes over the centre of the substrate. Where multiple scan lines are formed, the positions of the other scan lines may be determined by the position of the scan line that passes through the centre of the substrate. For example, fixing the position of the central scan line and ensuring a desired pitch will dictate the position of the other scan lines.

From further aspects, the present invention resides in a controller in an ion implanter arranged to implement the above methods and an ion implanter comprising such a controller.

BRIEF DESCRIPTION OF THE DRAWINGS

Embodiments of the present invention will now be described with reference to the accompanying drawings, of which.

DETAILED DESCRIPTION OF THE INVENTION

Figure 3:
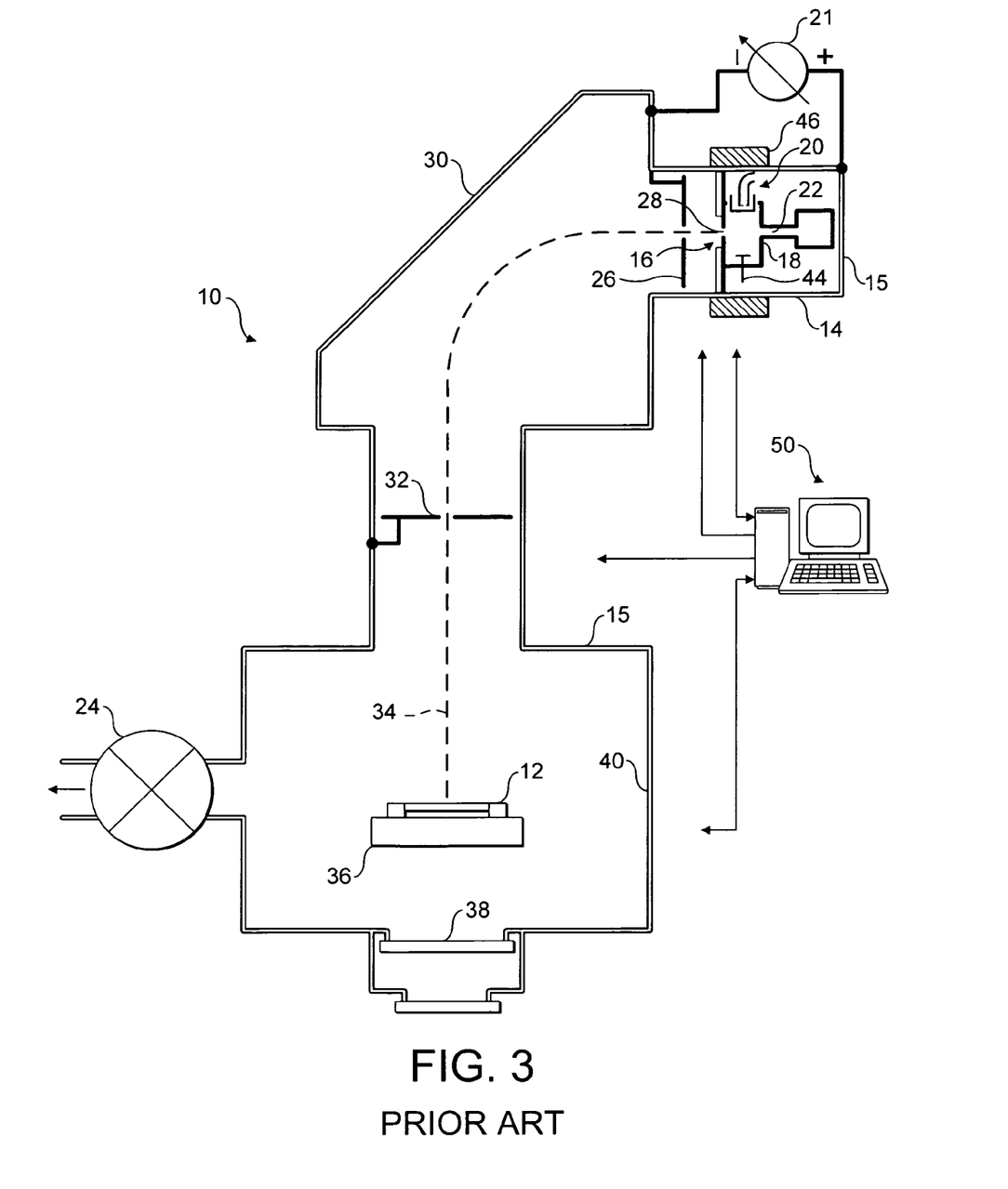
FIG. 3 shows a conventional ion implanter.

FIG. 3 shows a known ion implanter 10 for implanting ions in substrates 12, and that may be used to implement the present invention. Ions are generated by the ion source 14 to be extracted and follow an ion path 34 that passes, in this embodiment, through a mass analysis stage 30. Ions of a desired mass are selected to pass through a mass-resolving slit 32 and then to strike the semiconductor substrate 12.

The ion implanter 10 contains an ion source 14 for generating an ion beam of a desired species that is located within a vacuum chamber 15 evacuated by pump 24. The ion source 14 generally comprises an arc chamber 16 containing a cathode 20 located at one end thereof. The ion source 14 may be operated such that an anode is provided by the walls 18 of the arc chamber 16. The cathode 20 is heated sufficiently to generate thermal electrons.

Thermal electrons emitted by the cathode 20 are attracted to the anode, the adjacent chamber walls 18 in this case. The thermal electrons ionise gas molecules as they traverse the arc chamber 16, thereby forming a plasma and generating the desired ions.

The path followed by the thermal electrons may be controlled to prevent the electrons merely following the shortest path to the chamber walls 18. A magnet assembly 46 provides a magnetic field extending through the arc chamber 16 such that thermal electrons follow a spiral path along the length of the arc chamber 16 towards a counter-cathode 44 located at the opposite end of the arc chamber 16.

A gas feed 22 fills the arc chamber 16 with the species to be implanted or with a precursor gas species. The arc chamber 16 is maintained at a reduced pressure within the vacuum chamber 15. The thermal electrons travelling through the arc chamber 16 ionise the gas molecules present in the arc chamber 16 and may also crack molecules. The ions (that may comprise a mixture of ions) created in the plasma will also contain trace amounts of contaminant ions (e.g. generated from the material of the chamber walls 18).

Ions from within the arc chamber 16 are extracted through an exit aperture 28 provided in a front plate of the arc chamber 16 using a negatively-biased (relative to ground) extraction electrode 26. A potential difference is applied between the ion source 14 and the following mass analysis stage 30 by a power supply 21 to accelerate extracted ions, the ion source 14 and mass analysis stage 30 being electrically isolated from each other by an insulator (not shown). The mixture of extracted ions are then passed through the mass analysis stage 30 so that they pass around a curved path under the influence of a magnetic field. The radius of curvature traveled by any ion is determined by its mass, charge state and energy, and the magnetic field is controlled so that, for a set beam energy, only those ions with a desired mass to charge ratio and energy exit along a path coincident with the mass-resolving slit 32. The emergent ion beam is then transported to the process chamber 40 where the target is located, i.e. the substrate 12 to be implanted or a beam stop 38 when there is no substrate 12 in the target position. In other modes, the beam may also be accelerated or decelerated using a lens assembly positioned between the mass analysis stage 30 and the substrate position.

The substrate 12 is mounted on a substrate holder 36, substrates 12 being successively transferred to and from the substrate holder 36, for example through a load lock (not shown). The substrate holder 36 may be of any conventional design that provides linear translation of the substrate 12 in both x- and y-axis directions (the ion beam path 34 defining the z axis, and the x axis is taken to be horizontal and the y axis vertical), while also providing rotation of the substrate 12 about its centre. For example the possibilities include: a cantilevered scanning arm that effects linear movements like that described in U.S. Pat. No. 6,956,223 which is incorporated herein in its entirety; a scanning arm provided with rotary joints that are moved to effect scanning like those described in our co-pending U.S. patent application Ser. No. 11/588,432 which is incorporated herein in its entirety; or a reactive mass scanning arrangements like that described in our co-pending U.S. patent application Ser. No. 11/589,312 which is incorporated herein in its entirety.

The ion implanter 10 operates under the management of a controller, such as a suitably programmed computer 50. The controller 50 controls scanning of the wafer 12 through the ion beam 34 to effect desired scanning patterns.

Figure 4:
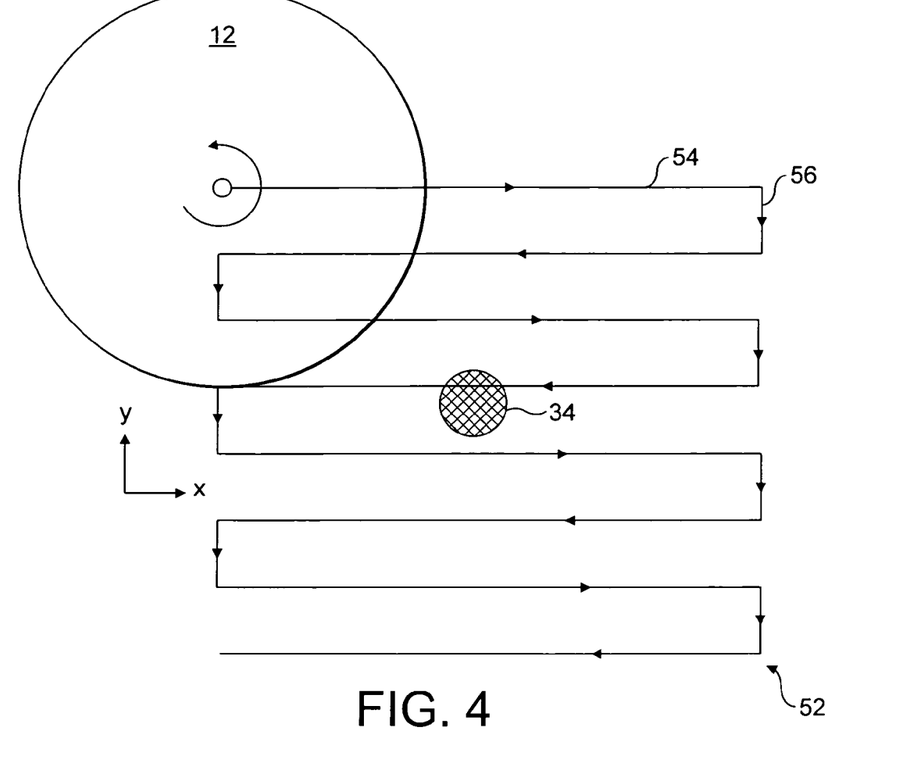
FIG. 4 is a schematic showing a substrate being scanned through an ion beam in accordance with an embodiment of the present invention.

FIG. 4 shows the motion described by the substrate 12 as it is scanned through the ion beam 34 by the controller 50. The substrate 12, in this embodiment, is a standard 300 mm silicon wafer commonly used in the semiconductor industry. Of course, other sizes and types of wafers may be used. The ion beam 34 is a typical spot beam with a reasonably uniform diameter of 50 mm. The controller 50 may manage operation of the ion implanter 10 to control, to a certain extent, the size and shape of the ion beam 34. For example, the controller 50 may vary operational properties of the ion source 14 or of ion optics that guide the ion beam 34 through the ion implanter 10. Some steering of the ion beam 34 is possible, although generally the ion beam 34 will be fixed as the wafer 12 is mechanically scanned therethrough.

The controller 50 directs the substrate holder 36 to scan the wafer 12 through the ion beam 34 to follow the raster scan indicated at 52. The raster scan 52 comprises a series of scan lines 54 formed in alternate directions by reciprocal motion of the wafer 12 in the fast scan direction (left and right along the x-axis direction), separated by steps 56 formed by periodic stepwise motion in the slow scan direction (downwardly in the y-axis direction). Hence, the motion of the wafer 12 in the fast scan direction must be reversed between successive scan lines 54, while its motion in the slow scan direction is in the same direction. Simultaneously, the controller 50 directs the substrate holder 36 to spin the wafer 12 about its centre. The direction of spin is indicated in FIG. 4 and is kept the same for all scan lines 54 (and this can be either clockwise or anticlockwise, as is desired). The wafer 12 is translated at 360 mm/sec and is rotated at 1200 rpm, leading to approximately twenty revolutions per scan line 54. Other values may be chosen. For example, the spin speed may be varied although a speed sufficient to allow 15 to 20 revolutions of the wafer 12 along each scan line 54 is preferred.

An advantage of rotating the wafer 12 while moving the wafer 12 through the ion beam 34 along each scan line 54 is that a larger pitch between adjacent scan lines 54 may be realised without compromising uniformity of implant: in this embodiment a pitch of 50 mm was used. In a conventional raster scan, where no rotation of the wafer 12 is performed, such a pitch would lead to there being only minimal overlap between the stripes of wafer 12 dosed as adjacent scan lines 54 are formed.

A further advantage of rotating the wafer 12 while moving the wafer 12 along each scan line 54 is that the problematic angular effects described above are avoided. This is because rotating the wafer 12 ensures that the wafer 12 sees the ion beam 34 over the full range of 360°.

It is not so straightforward to envisage how the combined translation and rotation of the wafer 12 provides another advantage, namely uniformity of implant of the wafer 12. However, an understanding becomes readily apparent when the implant process is thought of in the following way.

Figure 5:
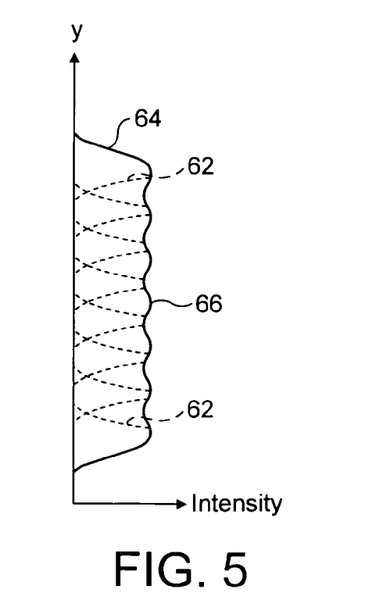
FIG. 5 shows how multiple scan lines add to form a virtual ribbon beam.
Figure 6:
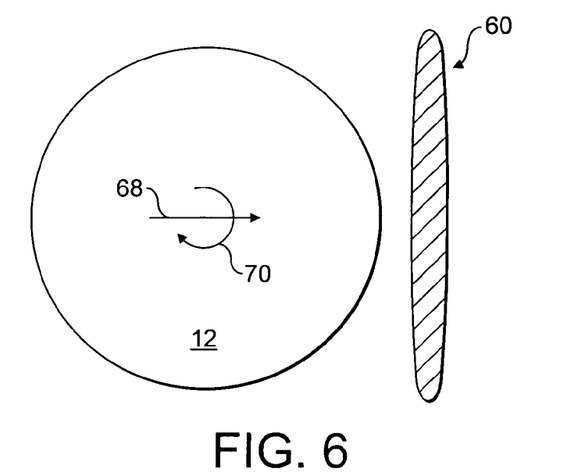
FIG. 6 is a graphical representation of a wafer being spun and moved towards a virtual ribbon beam.

Rather than considering the scan lines 54 of the raster pattern 52 being formed successively, they may be thought of as being formed concurrently, i.e. all scan lines 54 are formed in one pass of a plurality of spot ion beams 34 over the wafer 12. The size of each ion beam 34 and the pitch used means that the plurality of spot ion beams 34 overlap and so may be regarded as a virtual ribbon beam 60, as shown in FIG. 6. FIG. 5 shows how the intensity of this virtual ribbon beam 60 in the slow scan direction is derived from the individual spot beams 34. The ion beam current profiles 62 of the spot ion beams 34 at each scan line 54 is shown, and adding these individual contributions provides the current profile 64 of the virtual ribbon beam 60. The resulting profile 64 of the virtual ribbon beam 60 has a broadly flat top that extends over the height of the wafer 12. However, in practice the individual profiles 62 do not add to form a perfectly flat top, but instead the top exhibits a periodic ripple 66.

To demonstrate that spinning the wafer 12 does not have a detrimental effect on dosing uniformity, first consider a hypothetical perfect ribbon beam, i.e. a ribbon beam exhibiting no ripple 66 but instead having a perfect flat top in the region that passes over the wafer 12. Clearly, passing a wafer 12 through this perfect ribbon beam without spinning the wafer 12 will lead to a perfect uniform implant. It is easy to see that spinning the wafer 12 while it passes through the perfect ribbon beam will have no detrimental effect as all points on the wafer 12 will still see exactly the same total amount of ion beam current.

To appreciate that spinning the wafer 12 in fact has a beneficial effect on the uniformity of implant, we should return to the rippled virtual ion beam 60 that is equivalent to our multiple passes of a spot ion beam 34 over the wafer 12. Passing the wafer 12 through this virtual ion beam 60 without spinning the wafer 12 results in any particular point on the wafer 12 seeing only one particular part of the ripple 66 on the virtual ion beam 60. For example, a first point may pass through a peak in the ripple 66 and a second point may only pass through a trough in the ripple 66. Hence, the first point will receive a greater dose than the second point. Considering the wafer 12 as a whole, the dose it receives will exhibit stripes extending in the fast-scan direction. Put another way, the wafer 12 will have stripes due to lines of high dose corresponding to peaks in the ripple 66 and lines of low dose corresponding to troughs in the ripple 66: the high doses correspond to points on the wafer 12 that see the centre of the spot ion beam 34 pass overhead and the low doses correspond to points on the wafer 12 that see the outer edges of the spot ion beam pass overhead.

Turning now to a combination of translating and spinning the wafer 12, it can be appreciated that any point on the wafer 12 (the centre point aside) will see different parts of the virtual ion beam 60 as it spins with the wafer 12. FIG. 6 shows schematically the equivalent movement of the wafer 12 through the virtual ribbon beam 60, with arrow 68 indicating the translation of wafer 12 and arrow 70 indicating the rotation of wafer 12.

Figure 7:
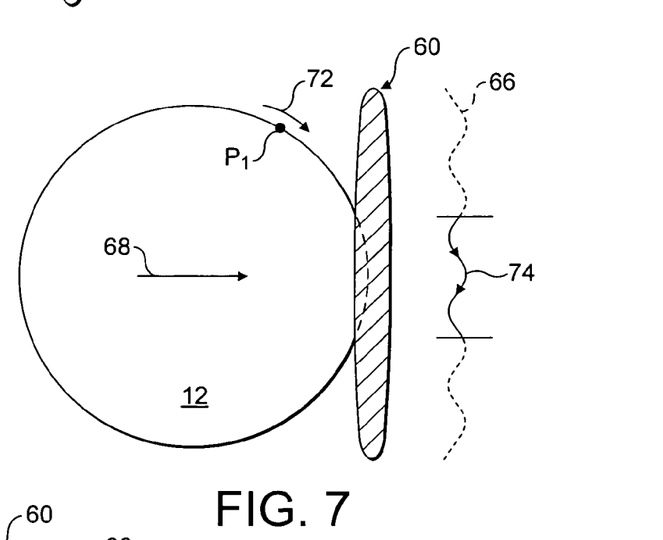
FIG. 7 is a graphical representation of the wafer of FIG. 6 being moved into the virtual ribbon beam to show a position where the virtual ribbon beam first makes contact with the wafer, and also illustrates the part of the virtual ribbon beam seen by a point on the edge of the wafer as it is spun through the virtual ribbon beam.

FIG. 7 shows the wafer 12 further translated in the fast-scan direction towards virtual ribbon beam 60, at a point where it just contacts the beam 60. Taking a point $P_1$ on the periphery of the wafer 12, it will rotate with the wafer 12 in the direction 72. In FIG. 7, point $P_1$ just clips the central part of virtual ribbon beam 60. The ripple 66 in the virtual ribbon beam 60 is shown to the right in FIG. 7. As the point $P_1$ rotates to clip the centre of the virtual ribbon beam 60, it effectively scans down a central segment 74 of the ripple 66, as indicated in FIG. 7. As will be understood, segment 74 is initially very small as the wafer 12 first clips the virtual ribbon beam 60, and segment 74 then expands as the wafer 12 is driven further into the virtual ribbon beam 60.

Figure 8:
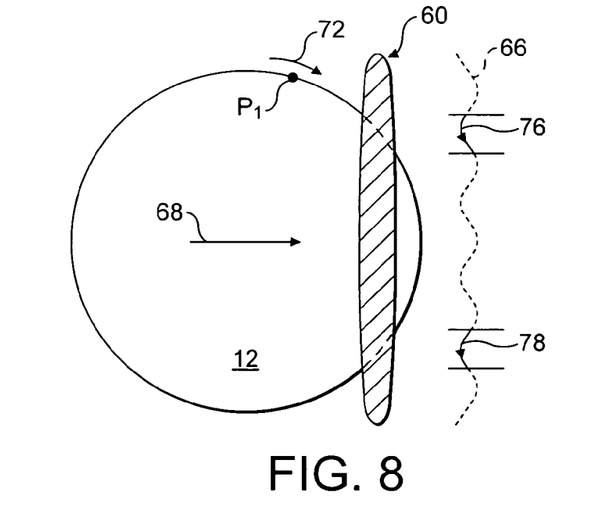
FIG. 8 continues the motion indicated in FIG. 6 and shows the virtual ribbon beam part way across the wafer.

FIG. 8 shows the wafer 12 further translated in direction 68 such that the leading edge of the wafer 12 is now a little way clear of the far side of virtual ribbon beam 60. Point $P_1$ spinning on the edge of the wafer 12 now passes through the virtual ribbon beam 60 before emerging on the far side of the beam 60, before passing back through the beam 60 once more. As shown to the right in FIG. 8, this results in point $P_1$ scanning down two separate segments 76 and 78 of the ripple 66.

Considering the gradual movement of the wafer 12 into the virtual ribbon beam 60 that will occure between the stages shown in FIGS. 7 and 8, the single segment 74 in the ripple 66 of FIG. 7 expands until the leading edge of the wafer 12 breaks clear of the far side of the virtual ribbon beam 60 at which point the single segment 74 divides into the two segments 76 and 78. As the wafer 12 continues its motion, segments 76 and 78 move outwardly along the ripple 66 as the point $P_1$ intercepts the beam 60 further and further towards the beam's edges.

Figure 9:
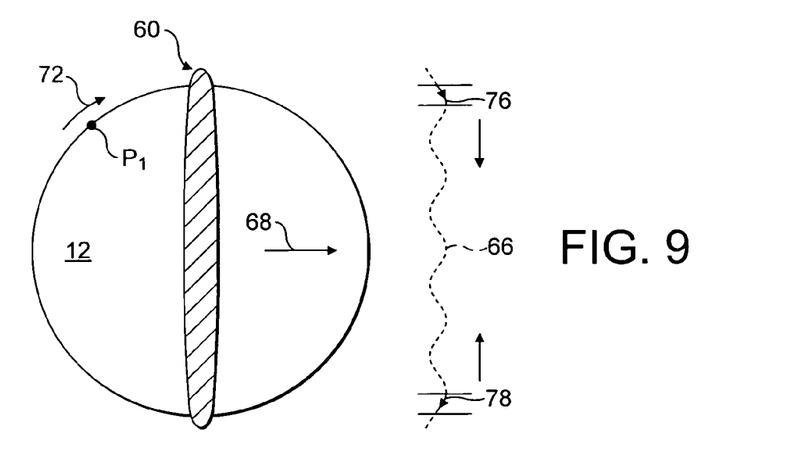
FIG. 9 continues the motion indicated in FIG. 6 and shows the virtual ribbon beam half way across the wafer.

FIG. 9 shows the wafer 12 driven into the virtual ribbon beam 60 such that the beam 60 extends across the centre of the wafer 12. In this position, the segments 76 and 78 have moved outwardly along the ripple 66 to be at their extremes. As motion of the wafer 12 through the virtual ribbon beam 60 continues, the segments 76 and 78 move back inwardly across the ripple 66 to join once more as a central segment 74.

Thus, the overall movement of the wafer 12 through the virtual ribbon beam 60 is such that point $P_1$ sees virtually all the ripple 66. The effect of point $P_1$ scanning over all the peaks and troughs in the ripple 66 is that point $P_1$ sees what will be close to the average ion beam current rather than just seeing a single value as was the case described above where the wafer 12 is not spun. Clearly, the more peaks and troughs that are sampled, the closer the dose seen by point $P_1$ will be to the average.

Figure 10:
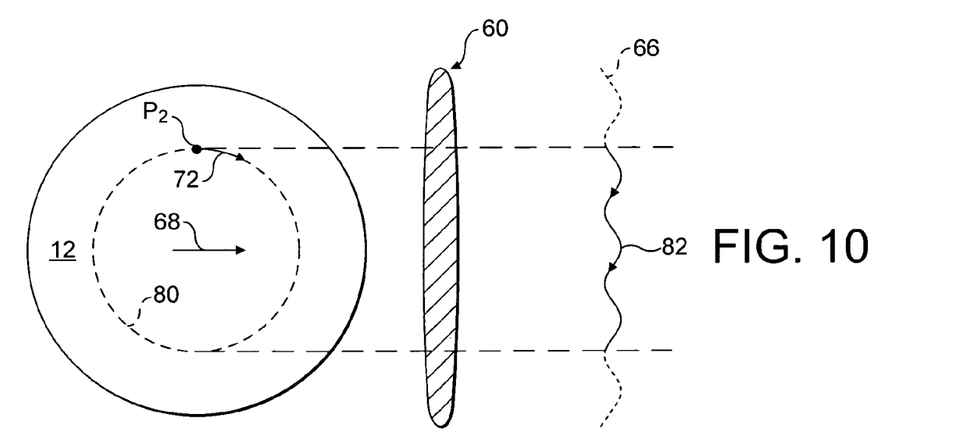
FIG. 10 is a graphical representation of the wafer and virtual ribbon beam of FIG. 6, and shows the part of the virtual ribbon beam seen by a point on the wafer displaced inwardly from the edge as the virtual ribbon beam scans over the wafer.

FIG. 10 shows the wafer 12 and virtual ribbon beam 60 once more, but this time considers a second point $P_2$ that resides inward of the edge of the wafer 12, in this case about a quarter of the way in a long a radius. As wafer 12 spins, point $P_2$ follows the path indicated by the circle 80. As the wafer 12 passes through the virtual ribbon beam 60, point $P_2$ first scans the central segment 74 of the ripple 66 and then the pair of segments 76 and 78. After the pass of the wafer 12 through the virtual ribbon beam 60, point $P_2$ has seen the segment 82 of the ripple 66 indicated in FIG. 10. As point $P_2$ is inset from the edge of the wafer 12, segment 82 extends across only a fraction of ripple 66 with a width corresponding to the diameter of circle 80. As a result, point $P_2$ samples a smaller part of the ripple 66 than point $P_1$ that was on the edge of the wafer 12. Nonetheless, point $P_2$ still sees multiple peaks and troughs in the ripple 66 and so sees an averaged amount of ion beam current.

Figure 11:
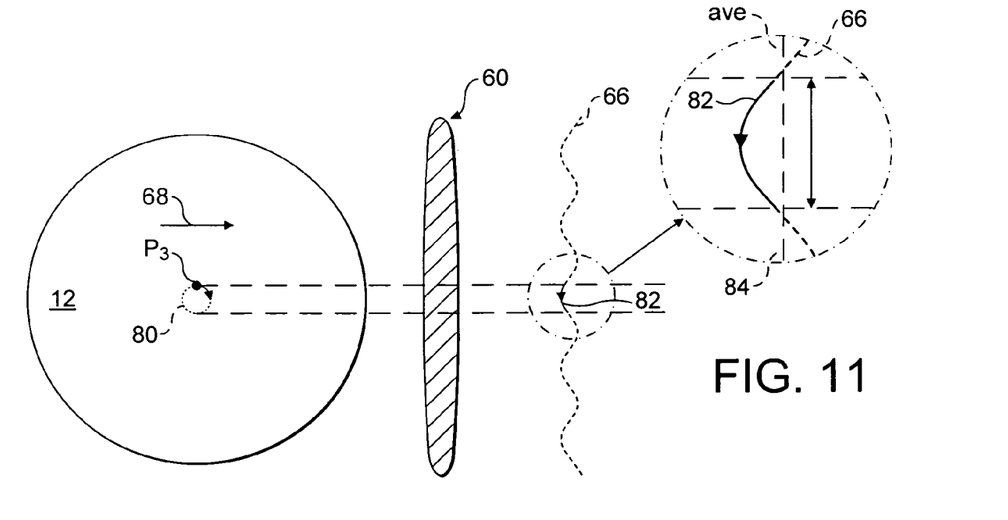
FIG. 11 is a graphical representation of the wafer and virtual ribbon beam of FIG. 6, and shows the part of the virtual ribbon beam seen by a point close to the centre of the wafer as the virtual ribbon beam scans over the wafer.

As we take other points that reside closer and closer towards the centre of the wafer 12, the segment 82 of the ripple 66 scanned by the point gets ever and ever smaller such that the number of peaks and troughs seen by the point decreases. As a result, the averaging effect works less and less well. Eventually, points are reached that do not see a full cycle of the ripple 66. FIG. 11 shows such a point $P_3$ that resides just a small distance from the centre of the wafer 12.

Point $P_3$ follows circle 80 as the wafer 12 spins, and mapping the diameter of circle 80 to the ripple 66 shown to the right in FIG. 11 shows that only a small segment 82 of the ripple 66 is seen by point $P_3$. The detail from the ripple 66 shown in the far right of FIG. 11 demonstrates that, in this embodiment, the segment 82 seen by point $P_3$ sits in a trough of the ripple 66. As a result, point $P_3$ always receives ion beam current that sits below the average ion beam current value shown at 84 in the detail. Hence, point $P_3$ receives a below average dose during the implant.

Figure 12:
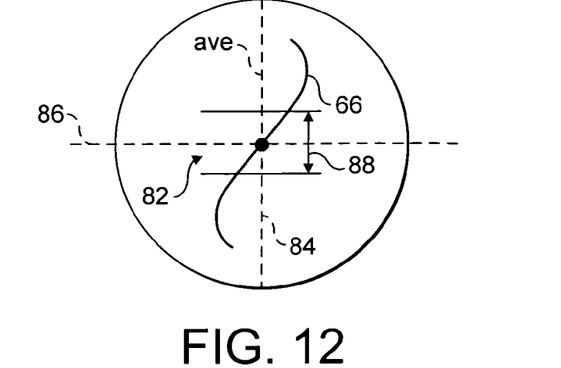
FIGS. 12 and 13 shows schematically how scan lines can be positioned relative to the centre of the wafer such that any point on the wafer will effectively see an average current as it scans the resulting ripple in the virtual ribbon beam, and hence illustrates how to ensure uniform dosing at the centre of the wafer.

This potential problem may be overcome by careful selection of which part of the ion beam 34 traces across the centre of the wafer 12. FIG. 12 corresponds to the detail of FIG. 11, but shows that ripple 66 shifted such that the centre of the wafer 12 (indicated by line 86) passes through the ripple 66 where its value is equal to the average current value 84. Hence, the centre point of the wafer 12 will see the average current value (as it effectively traces a line through the virtual ribbon beam 60). Moreover, points further and further away radially from the centre of the wafer 12 will see the segments 82 of the ripple 66 that they sample expand across the ripple 66 symmetrically, as indicated by arrow 88, such that they are symmetric about the average ion beam current. Hence, each point sees an average amount of ion beam current irrespective of its position on the wafer 12.

Figure 13:
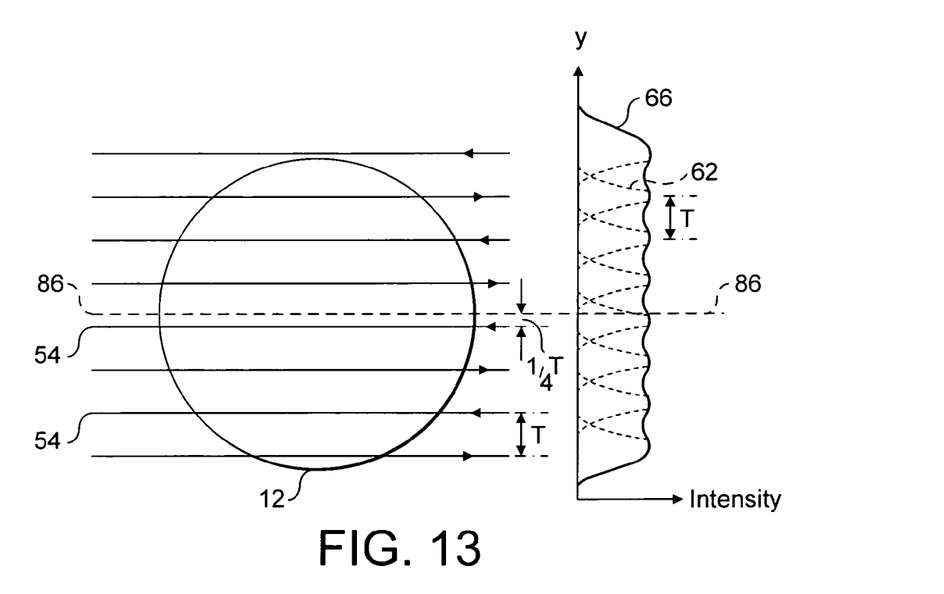

FIG. 13 shows how this notional aligning of the average current 84 of the ripple 66 with the centre 86 of the wafer 12 relates to the actual situation of scanning the wafer 12 relative to the spot beam 34 along the series of scan lines 54. The left hand side of FIG. 13 shows a series of scan lines 54 extending across the wafer 12, each scan line 54 corresponding to the centre of the spot ion beam 34 and hence the peak in its current profile 62. The centre of the wafer 12 is also shown by line 86. The right hand side of FIG. 13 corresponds to FIG. 5 and shows the virtual ribbon beam 60 created by the spot ion beam 34 as it travels along the scan lines 54. The ripple 66 on the virtual ribbon beam 60 is correctly aligned such that it is at its average value 84 at the centre line 86. As can be seen, the peaks in the ripple 66 correspond to the peaks in the individual current profiles 62, and hence the position of scan lines 54 shown across the wafer 12. The troughs in the ripple 66 correspond to the midpoints between scan lines 54. Typically, the average current value 84 occurs half-way between a peak and a trough and so corresponds to a quarter of the way from one scan line 54 to the next 54. Hence, if the scan lines 54 are spaced with a pitch T, the scan line 54 closest to the centre of the wafer 12 should be formed by scanning the wafer 12 such that the centre of the spot ion beam 34 passes along a line offset by T/4 from the centreline 86 of the wafer 12. The remaining scan lines 54 may be arranged according to the pitch spacing T.

Figure 14:
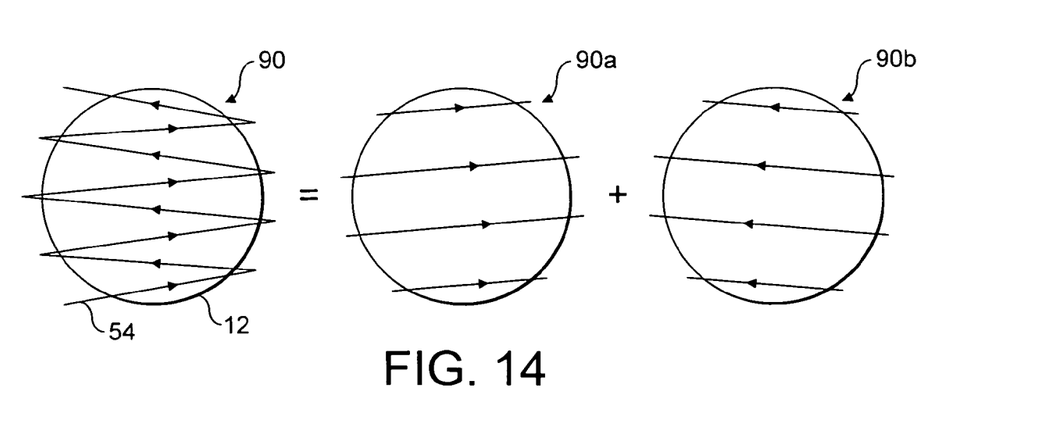
FIG. 14 illustrates how a saw-tooth raster scan can be thought of as two scans through a virtual ribbon beam and hence how uniformity is preserved.

The present invention may be used with scan patterns other than the raster pattern illustrated in FIG. 4. For example, the controller 50 may direct the substrate holder 36 to effect a constant motion in the slow-scan direction rather than the stepped motion described above. Implementing the same reciprocal motion in the fast scan direction causes the ion beam 34 to trace a saw-tooth scan pattern 90 like that shown in FIG. 14. As before, spinning the substrate 12 while performing this saw-tooth scan also results in uniform dosing of the wafer 12. This can be appreciated by equating the single saw-tooth scan pattern 90 to a pair of scan patterns 90a and 90b that are rotated relative to one another as shown in FIG. 14. Each scan pattern 90a and 90b comprises a series of parallel scan lines akin to the raster pattern 52 already described. Each scan pattern 90a and 90b will see uniform dosing of the wafer 12 in the same way as for the raster patterns 52. Of course, performing these two uniform scan patterns 90a and 90b will result in an overall uniform scan pattern 90.

The skilled person will appreciate that changes may be made to the above-described embodiment without departing from the scope of the present invention.

For example, the dimensions of the substrate 12 and the ion beam 34 may be changed, as may the pitch spacing, the angular velocity of the spinning substrate 12 and the scanning speed of the substrate 12.

For example, the invention may be used with a variety of substrates 12. For example, substrate material and substrate shape and dimensions may be varied without departing from the scope of the present invention.

The dimensions of the ion beam 34 may also be varied. Varying the dimensions of the ion beam 34 may require a consideration of at least some of the other parameters affecting the scanning. For example, changing the height of the ion beam 34 (i.e. the dimension in the slow-scan direction) may necessitate a change in the pitch spacing. Remembering how the virtual ribbon beam 60 is formed by the overlapping ion beams 34 corresponding to the ion beam's position at adjacent scan lines 52 shown in FIG. 5, decreasing the height of the ion beam 34 may necessitate a reduction in pitch to ensure overlap between adjacent scan lines 52. Conversely, increasing the ion beam height may allow the pitch spacing to be increased without adversely affecting dose uniformity.

Figure 15A:
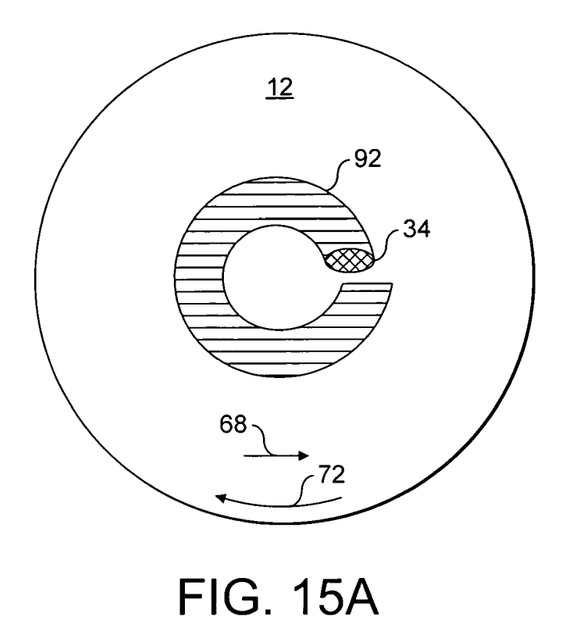
FIGS. 15a and 15b illustrate how spin speed and translation speed may be determined with respect to the width of the in beam.
Figure 15B:
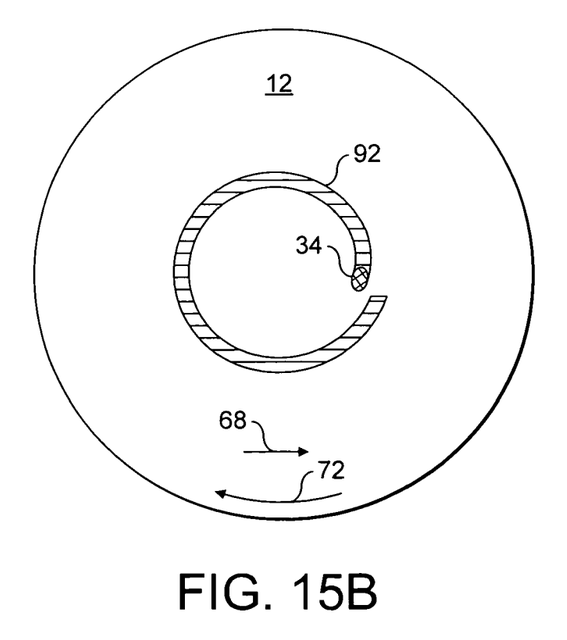

Varying the width of the ion beam 34 (i.e. the dimension in the fast-scan direction) may necessitate a change in the spin speed and/or translation speed of the wafer 12. This is illustrated in FIGS. 15a and 15b. FIG. 15a shows a wafer 12 being translated along line 68 through a wide ion beam 34 while the wafer 12 is spun in direction 72. Wide ion beam 34 traces a wide spiral 92 over the wafer 12 during motion (only part of the spiral 92 traced during a single revolution is shown in FIG. 15a). The spin speed of the wafer 12 is selected such that adjacent parts of the spiral 92 overlap, as will be clear from FIG. 15a. FIG. 15b corresponds to FIG. 15a, but shows a narrower ion beam 34. Translating the wafer 12 at the same speed and spinning the wafer 12 at the same speed results in adjacent parts of the spiral 92 no longer overlapping. To ensure that overlap is acquired, either the wafer 12 should be spun more quickly or the wafer 12 should be translated more slowly.

Obviously, the reverse of the above situations is true, namely that a change in pitch, translation speed or spin speed may require adjustment of the ion beam dimensions in the fast and slow scan directions.

A further parameter that may be varied is the offset of the centre of the ion beam 34 from the centre of the wafer 12, and the consequent arrangement of adjacent scan lines 52. The above arrangement demonstrates how uniform dosing may be achieved by ensuring a point in the ion beam 34 having average current passes through the centre line 86 of the wafer 12. Where this average current resides in the ion beam 34 is of course dependent upon the ion beam profile itself. Determining ion beam profiles is well known in the art, see for example our co-pending U.S. patent application Ser. Nos. 11/589,156 and 11/029,004. Determining the average position from such a profile is straightforward.

Variations in how the relative movement between ion beam 34 and wafer 12 is effected are possible. For instance, the ion beam 34 may be made to move relative to the substrate 12 rather than the arrangement described above. Realistically, the substrate 12 will be rotated rather than trying to spin the ion beam 34 around the substrate 12, but the ion beam 34 may be scanned in a raster pattern 52 across a spinning substrate 12.

The scan pattern achieved using relative motion between the wafer 12 and ion beam 34 may also be varied. A traditional square raster pattern 52 is shown in FIG. 4, and a saw-tooth pattern 90 is shown in FIG. 14, but others are possible. For example, a series of arcuate scan lines is possible, whether those arcs correspond to a series of concentric, variable radius arcs (like those that may be created using the scanning arm of our co-pending U.S. application Ser. No. 11/588,432) or to a series of non-concentric arcs of fixed radius. The latter pattern results in a series of arcs that are not parallel, but are considered as being substantially parallel.

The above embodiments describe using a spot ion beam 34 to form a series of scan lines 52 by translating the substrate 12 while also rotating the substrate 12. This creates a virtual ribbon beam 60. However, the present invention may be implemented with an actual ribbon beam. For example, a substrate 12 may be translated through a ribbon beam in the usual way but, at the same time, the substrate 12 may be rotated. Thus, any non-uniformities in the ribbon beam will be averaged out over the spinning substrate 12 such that improved uniformity is achieved.

The invention claimed is:

1. A method of scanning a substrate through an ion beam in an ion implanter, comprising:
    causing relative motion between the substrate and the ion beam; and
    rotating the substrate substantially about its centre while causing the relative motion, such that the ion beam would pass over all of the substrate even if the substrate were not rotating, the relative motion between the substrate and the ion beam being at a constant speed.

2. The method of claim 1, comprising rotating the substrate substantially about its centre at a constant angular velocity.

3. The method of claim 1, wherein the ion beam is a ribbon beam, and the method comprises causing a relative motion between the substrate and the ribbon beam such that all of the substrate passes through the ribbon beam in a single pass.

4. The method of claim 3, comprising rotating the substrate such that it performs at least a complete revolution during the pass.

5. The method of claim 4, comprising rotating the substrate such that it performs at least fifteen to twenty revolutions during the pass.

6. The method of claim 1, wherein the ion beam is a spot ion beam, the method comprising causing the relative motion between the substrate and the ion beam such that the ion beam passes over all of the substrate by causing a series of translations of the substrate relative to the ion beam such that the ion beam traces a series of scan lines over the substrate.

7. The method of claim 6, comprising causing the translations to form the series of scan lines to be parallel or substantially parallel.

8. The method of claim 7, comprising causing the translations to form a raster pattern or saw-tooth pattern of scan lines.

9. The method of claim 7, comprising causing the translations to form a series of overlapping scan lines, such that the edges of the path of the ion beam across the substrate at the start of adjacent scan lines overlap.

10. The method of claim 7, comprising forming the scan lines to be spaced with a pitch P and wherein the ion beam has a dimension D in the direction of the pitch spacing, such that P is greater than 0.9 D.

11. The method of claim 7, comprising forming the scan lines to be spaced with a pitch P and wherein the ion beam has a dimension D in the direction of the pitch spacing, such that D is substantially equal to P.

12. The method of claim 6, comprising rotating the substrate such that it performs at least a complete revolution as the ion beam scans across each scan line.

13. The method of claim 12, comprising rotating the substrate such that it performs at least fifteen to twenty revolutions as the ion beam scans across each scan line.

14. The method of claim 12, comprising rotating the substrate and/or causing the relative motion between the substrate and the ion beam such that the resulting spirals traced by the ion beam over the substrate overlap on adjacent revolutions.

15. The method of claim 1, comprising causing relative motion between the substrate and the ion beam to form a scan line such that a point in the ion beam, having an average value of the total ion beam current along a section taken through the ion beam orthogonal to the direction of relative motion, passes over the centre of the substrate.

16. An ion implanter controller arranged to perform the method of claim 1.

17. An ion implanter comprising the controller of claim 16.

18. A computer program stored on a computer-readable medium and comprising computer program instructions that, when executed by a computer in an ion implanter, cause the ion implanter to perform the method of claim 1.

19. A computer readable medium carrying thereon a computer program according to claim 18.

* * * * *